(12) United States Patent
Kuwabara et al.

(10) Patent No.: US 7,303,942 B2
(45) Date of Patent: Dec. 4, 2007

(54) SEMICONDUCTOR DEVICE AND METHOD FOR MANUFACTURING THE SAME

(75) Inventors: Hideaki Kuwabara, Kanagawa (JP); Junya Maruyama, Kanagawa (JP); Yumiko Ohno, Kanagawa (JP); Toru Takayama, Kanagawa (JP); Yuugo Goto, Kanagawa (JP); Etsuko Arakawa, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/735,767

(22) Filed: Dec. 16, 2003

(65) Prior Publication Data

US 2004/0124542 A1 Jul. 1, 2004

(30) Foreign Application Priority Data

Dec. 26, 2002 (JP) ............................. 2002-377816

(51) Int. Cl.
*H01L 21/44* (2006.01)
(52) U.S. Cl. ....................... 438/113; 438/118
(58) Field of Classification Search ................ 438/113, 438/114, 118, 119, 455, 458, 459, 460, 464, 438/465
See application file for complete search history.

(56) References Cited

U.S. PATENT DOCUMENTS

| | | |
|---|---|---|
| 5,206,749 A | 4/1993 | Zavracky et al. |
| 5,317,236 A | 5/1994 | Zavracky et al. |
| 5,376,561 A | 12/1994 | Vu et al. |
| 5,643,804 A | 7/1997 | Arai |
| 5,757,456 A | 5/1998 | Yamazaki |
| 5,804,872 A | 9/1998 | Miyano et al. |
| 5,821,138 A | 10/1998 | Yamazaki et al. |
| 5,834,327 A | 11/1998 | Yamazaki et al. |
| 5,861,666 A | 1/1999 | Bellaar |
| 5,877,533 A | 3/1999 | Arai |
| 5,976,953 A | 11/1999 | Zavracky |
| 6,027,958 A | 2/2000 | Vu et al. |

(Continued)

FOREIGN PATENT DOCUMENTS

CN 1256792 6/2000

(Continued)

OTHER PUBLICATIONS

*Exhibition of Active Matrix Type Organic EL Display at "13th Flat Panel Display Manufacturing Technology Expo & Conference"* by ELDis Group; Jul. 2, 2003 (full translation).

(Continued)

*Primary Examiner*—Kevin M. Picardat
(74) *Attorney, Agent, or Firm*—Fish & Richardson P.C.

(57) ABSTRACT

It is an object of the present invention to provide a technique for making a semiconductor device thinner without using a back-grinding method for a silicon wafer. According to the present invention, an integrated circuit film is mounted, thereby making a semiconductor device mounting the integrated circuit film thinner. The term "an integrated circuit film" means a film-like integrated circuit which is manufactured based on an integrated circuit manufactured by a semiconductor film formed over a substrate such as a glass substrate or a quartz substrate. In the present invention, the integrated circuit film is manufactured by a technique for transferring.

20 Claims, 9 Drawing Sheets

U.S. PATENT DOCUMENTS

| | | | |
|---|---|---|---|
| 6,043,800 A | 3/2000 | Spitzer et al. | |
| 6,118,502 A | 9/2000 | Yamazaki | |
| 6,127,199 A | 10/2000 | Inoue et al. | |
| 6,133,626 A | 10/2000 | Hawke et al. | |
| 6,143,582 A | 11/2000 | Vu et al. | |
| 6,208,521 B1 | 3/2001 | Nakatsuka | |
| 6,242,758 B1 | 6/2001 | Yamazaki | |
| 6,258,623 B1 | 7/2001 | Moden et al. | |
| 6,265,772 B1 | 7/2001 | Yoshida | |
| 6,312,304 B1 | 11/2001 | Duthaler et al. | |
| 6,372,608 B1 | 4/2002 | Shimoda et al. | |
| 6,376,333 B1 | 4/2002 | Yamazaki et al. | |
| 6,388,652 B1 | 5/2002 | Yamazaki et al. | |
| 6,410,960 B1 | 6/2002 | Arai | |
| 6,423,614 B1 | 7/2002 | Doyle | |
| 6,441,474 B2 | 8/2002 | Naitoh et al. | |
| 6,503,778 B1 | 1/2003 | Yamauchi et al. | |
| 6,506,681 B2 * | 1/2003 | Grigg et al. | 438/113 |
| 6,589,811 B2 * | 7/2003 | Sayyah | 438/119 |
| 6,645,830 B2 | 11/2003 | Shimoda | |
| 6,677,621 B2 | 1/2004 | Yamazaki et al. | |
| RE38,466 E | 3/2004 | Inoue | |
| 6,737,300 B2 * | 5/2004 | Ding et al. | 438/464 |
| 6,780,677 B2 * | 8/2004 | Imasu et al. | 438/119 |
| 6,818,850 B2 | 11/2004 | Bridges | |
| 6,830,494 B1 | 12/2004 | Yamazaki et al. | |
| 6,846,703 B2 | 1/2005 | Shimoda | |
| 6,883,934 B2 | 4/2005 | Kawakami et al. | |
| 6,946,361 B2 * | 9/2005 | Takayama et al. | 438/458 |
| 6,998,282 B1 | 2/2006 | Yamazaki | |
| 7,050,138 B1 | 5/2006 | Yamazaki | |
| 7,094,665 B2 | 8/2006 | Shimoda | |
| 7,214,555 B2 | 5/2007 | Yamazaki | |
| 2001/0040298 A1 | 11/2001 | Baba | |
| 2002/0016028 A1 | 2/2002 | Arao et al. | |
| 2002/0024096 A1 | 2/2002 | Yamazaki | |
| 2002/0030189 A1 | 3/2002 | Ishikawa | |
| 2002/0055237 A1 | 5/2002 | Sayyah | |
| 2002/0100941 A1 | 8/2002 | Yonehara | |
| 2002/0131007 A1 | 9/2002 | Yamazaki et al. | |
| 2002/0146893 A1 | 10/2002 | Shimoda et al. | |
| 2003/0025118 A1 | 2/2003 | Yamazaki et al. | |
| 2003/0032210 A1 | 2/2003 | Takayama et al. | |
| 2003/0047280 A1 | 3/2003 | Takayama et al. | |
| 2003/0047732 A1 | 3/2003 | Yamazaki et al. | |
| 2003/0057423 A1 | 3/2003 | Shimoda | |
| 2003/0064569 A1 | 4/2003 | Takayama et al. | |
| 2003/0082889 A1 | 5/2003 | Maruyama et al. | |
| 2003/0217805 A1 | 11/2003 | Takayama et al. | |
| 2003/0231263 A1 | 12/2003 | Kato et al. | |
| 2004/0046909 A1 | 3/2004 | Sekiguchi | |
| 2004/0087110 A1 | 5/2004 | Takayama et al. | |
| 2004/0121516 A1 | 6/2004 | Yamazaki et al. | |
| 2004/0140547 A1 | 7/2004 | Yamazaki et al. | |
| 2004/0212012 A1 | 10/2004 | Yamazaki et al. | |
| 2004/0232413 A1 | 11/2004 | Yamazaki et al. | |
| 2004/0238827 A1 | 12/2004 | Takayama et al. | |
| 2004/0263712 A1 | 12/2004 | Yamazaki | |
| 2005/0001211 A1 | 1/2005 | Yamazaki et al. | |
| 2005/0070038 A1 | 3/2005 | Yamazaki | |
| 2006/0030122 A1 | 2/2006 | Shimoda | |
| 2007/0010067 A1 | 1/2007 | Shimoda | |

FOREIGN PATENT DOCUMENTS

| | | |
|---|---|---|
| DE | 10047963 | 3/2001 |
| EP | 0 858 110 A1 | 8/1998 |
| EP | 1017100 | 7/2000 |
| EP | 1229582 | 8/2002 |
| EP | 1351308 | 10/2003 |
| EP | 1603163 | 12/2005 |
| EP | 1655633 | 5/2006 |
| EP | 1744365 | 1/2007 |
| EP | 1758169 | 2/2007 |
| JP | 60-178424 | 9/1985 |
| JP | 06-244360 | 9/1994 |
| JP | 08-186156 | 7/1996 |
| JP | 08-262474 | 10/1996 |
| JP | 10-125929 | 5/1998 |
| JP | 10-125930 | 5/1998 |
| JP | 10-125931 | 5/1998 |
| JP | 11-020360 | 1/1999 |
| JP | 11-074533 | 3/1999 |
| JP | 2000-004024 | 1/2000 |
| JP | 2000-061785 | 2/2000 |
| JP | 2000-294723 | 10/2000 |
| JP | 2002-049359 | 2/2002 |
| JP | 2002 189447 | 7/2002 |
| JP | 2002-244576 | 8/2002 |
| JP | 3408154 | 5/2003 |

OTHER PUBLICATIONS

Documents distributed in the "*13th Flat Panel Display Manufacturing Technology Expo& Conference*" by ELDis Group; Jul. 3, 2003 (full translation).

"Mass Production of Organic EL Devices"; *Shimotsuke Newspaper*; Jul. 3, 2003 (full translation).

"Two-way display developed"; Newspaper "*The Japan Times*"; Jul. 3, 2003.

Watanabe et al.; "Anisotropic Conductive Films for Flat Panel Displays"; *AM-LCD/IDW '96*; pp. 369-372; Nov. 27, 1996.

European Search Report dated Aug. 22, 2006 for European Patent Office Application No. 03029012.6, 5 pages.

Zhang, X. et al., "Thermal Conductivity and Diffusivity of Free-Standing Silicon Nitride Thin Films"; *Review of Scientific Instruments*, vol. 66, No. 2, Part 1; pp. 1115-1120; Feb. 1995.

Office Action, Chinese Patent Application No. 200310123558.0; CN6847 dated Jun. 8, 2007.

\* cited by examiner

SEMICONDUCTOR DEVICE AND METHOD FOR MANUFACTURING THE SAME

BACKGROUND OF THE INVENTION

1. Field of the Invention

The present invention relates to a technique for mounting a semiconductor. Specifically, the present invention relates to a semiconductor device mounting an integrated circuit film manufacturing by a technique for transferring and a method for manufacturing the same.

2. Description of the Related Art

For the sake of making a semiconductor device mounting a semiconductor chip miniaturized and thinner, it is more necessary to make the semiconductor chip thinner.

In general, as for the technique for mounting a semiconductor, a backside (that is a part of a semiconductor that does not function as an element) of a silicon wafer in which a semiconductor element is formed is grinded (back-grind) to make the silicon wafer thinner, that is, to several hundreds μm in thickness.

However, there is a problem of causing retroflexion of a thinned silicon wafer due to the effects of stress of an insulating film or wirings formed over the silicon wafer. The retroflexion of a silicon wafer causes a difficulty in dicing or the like, and thus, it is an obstacle to making a semiconductor chip much thinner.

Therefore, there is a measure, for example, a measure for suppressing a retroflexion of a silicon wafer by devising the way to bond a protective sheet in a back-grinding process of a silicon wafer (Reference: Japanese Patent Laid Open No. 2000-61785).

In addition, in the back-grinding process, a defect made in the backside of a wafer is also an obstacle to making a semiconductor chip thinner.

Accordingly, in order to solve the above-described problems, it is required to develop a new technique for mounting a semiconductor to make a semiconductor chip thinner without depending on a backside processing of a silicon wafer.

SUMMARY OF THE INVENTION

The present invention has been made in view of the above-described problems. It is an object of the present invention to provide a semiconductor device mounting an integrated circuit film manufactured by a technique for transferring and a method for manufacturing the semiconductor device.

A semiconductor device of the present invention is characterized in that an integrated circuit film fabricated by a technique for transferring is mounted over the semiconductor device.

In this specification, the term "an integrated circuit film" means a film-like integrated circuit which is manufactured by a method as follows: after a semiconductor film is formed over a substrate, an integrated circuit is element-separated by separating the semiconductor film to island-like semiconductors and is separated from the substrate. A glass substrate or a quartz substrate may be employed as the substrate. As a method for separating an integrated circuit from the substrate, a technique for transferring, an etching technique for selectively etching only the substrate, or the like can be adopted.

According to the present invention, an integrated circuit film mounted over a semiconductor device has a plurality of elements separated in island-like. The semiconductor layer constituting each of elements is separated in island-like and is formed to be from 30 nm to 60 nm in thickness. An integrated circuit formed from multiple elements has a logic circuit, a memory and the like.

A thickness of a semiconductor chip that is conventionally used depends mainly on a thickness of a semiconductor layer. An integrated circuit film formed by a technique for transferring is a film including a semiconductor layer with a thickness of from 30 nm to 60 nm, and is much thinner than a semiconductor chip.

In an integrated circuit film mounted over a semiconductor device of the present invention, a film face of a semiconductor layer constituting each element has a plurality of plane directions.

A thickness of an integrated circuit film including the semiconductor layer of from 30 nm to 60 nm in thickness as described above depends mainly on the number of wirings and laminates of interlayer insulating films.

A semiconductor device of the present invention is characterized in that the semiconductor device includes a film that is in contact with an integrated circuit film and whose thermal conductivity is 10 W/m·K or more.

By providing such a film having good thermal conductivity as described above, heat generated within the integrated circuit film is easily diffused.

The semiconductor device of the present invention is characterized in that the integrated circuit film is electrically connected to a wiring substrate by a protruding electrode therebetween.

Note that, the wiring substrate is formed from an insulator such as polyimide and an electrical conductor such as copper. The substrate may be either of a hard substrate or a flexible substrate. As the insulator, a ceramic material such as alumina or aluminum nitride can be used as well as a resin material such as polyimide or glass epoxy resin. Further, a material such as gold may be used as well as copper. The protruding electrode is an electrical conductor formed by plating or solder having a thickness of 10 to 30 μm.

In the substrate, a plurality of integrated circuit films may be disposed horizontally. Each integrated circuit film has a different function, for example, CPU, a memory, or the like.

According to the present invention, the integrated circuit film is polygonal. This is because the integrated circuit film is not required to be cleaved depending on a cleaved surface as a silicon wafer.

DETAILED DESCRIPTION OF THE
PREFERRED EMBODIMENTS

Embodiment Modes

Embodiment Mode 1

This embodiment mode of the present invention is described with reference FIGS. 1A to 1C. A semiconductor device mounting an integrated circuit film formed by a technique for transferring is described in the present invention.

Figure 1A:
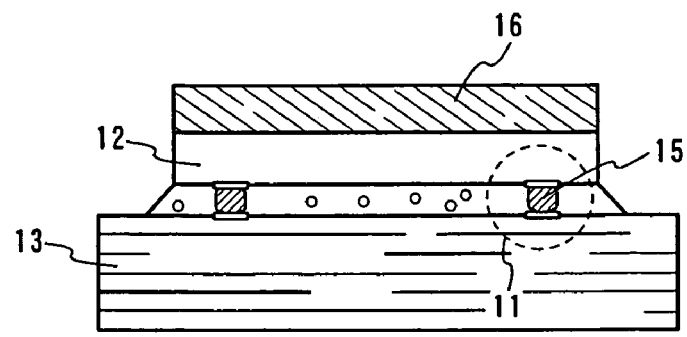
FIGS. 1A to 1C show a semiconductor device according to the present invention.

An integrated circuit film 12 is electrically connected to a substrate 13 by a protruding electrode (bump) 15 therebetween in FIG. 1A. The integrated circuit film 12 is formed by peeling off a layer including TFTs formed over a glass substrate and wirings for driving the TFTs by a technique for transferring. Namely, it is an integrated circuit film that is made thinner without a back-grinding process as a silicon wafer. The substrate 13 is a multi-layer wiring board in which a conductive material such as copper is wired in a polyimide film.

The semiconductor device of this embodiment mode has a face-down structure. The face-down structure is a structure in which a top-side of a staggered TFT 21 (that is a gate electrode side in the case of considering the semiconductor layer as a center) formed within the integrated circuit film 12 can be faced with the substrate 13.

A plurality of TFTs is provided for the integrated circuit film 12. The TFTs comprising semiconductor layers formed by separating a polycrystalline silicon film into an island-like shape.

Figure 1B:
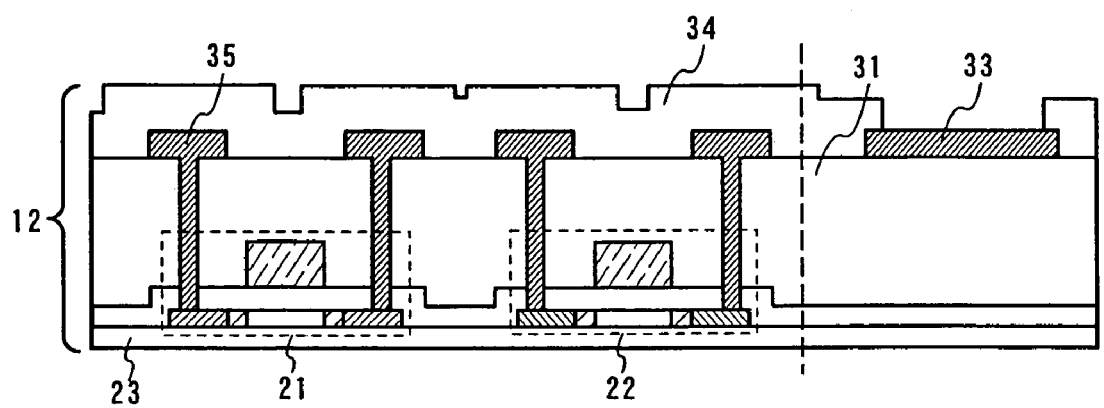

FIG. 1B shows a cross-sectional view of a part of the integrated circuit film 12. An n-channel TFT 21 and a p-channel TFT 22 are formed over an insulating film 23. A semiconductor layer of the TFTs 21 and 22 has a thickness of from 30 nm to 60 nm. A wiring 35 for transmitting electric signal to the TFTs 21 and 22 is formed over an insulating film 31 covering the TFTs 21 and 22. An electrode 33 is formed in the same layer as the wiring 35. The electrode 33 is exposed in an opening portion of a protective film 34 for protecting the TFT 21 and 22, the wiring 35, and the like. The wiring 35 is made of aluminum containing 1% silicon and the interlayer insulating film is made of a film such as a silicon oxide film that can resist heat at the temperatures of 250° C. or more. It is noted that the integrated circuit film 12 is made by peeling off a TFT layer formed over a glass substrate by a technique for transferring and has a thickness of approximately from 1 μm to 10 μm. Note that, a TFT layer includes wirings, insulating films and the like as well as a TFT.

A film 16 made of a material having good thermal conductivity is formed in a side opposite to the electrode 33 where an insulating film 23 is provided within the integrated circuit 12. By providing the film 16, heat generated within the integrated circuit film 12 can be diffused. The film 16 may be a metal material (such as aluminum) having thermal conductivity of about 10 W/m·K or more, a ceramic material (such as a diamond like carbon (DLC)) having carbon or aluminum as a main component, alumina, or the like.

Figure 1C:
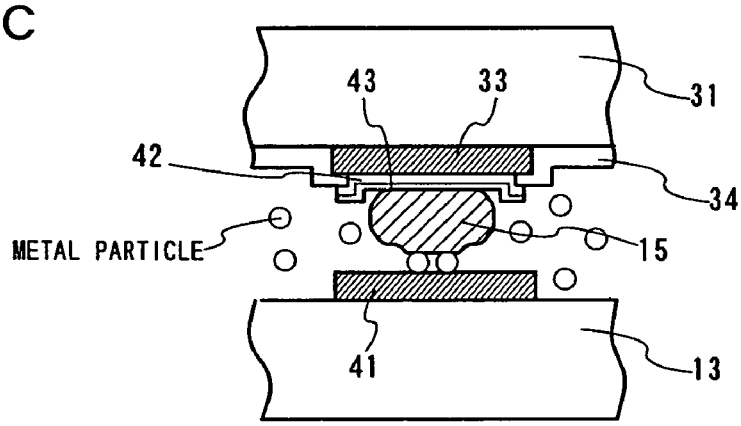

FIG. 1C is a cross-sectional view showing a connecting portion (a portion surrounded by a dotted line 11) in which the integrated circuit film 12 is connected to the substrate 13. Conductive films 42 and 43 are laminated over the electrode 33 and the protruding electrode 15 is formed in order to be contact with the conductive film 43. The integrated circuit film 12 is bonded to the substrate 13 by an adhesive. An electrode 41 is electrically connected to the protruding electrode 15 via metal particles within the adhesive. Alternatively, the electrode 41 may electrically be connected to the protruding electrode 15 via a conductive paste or the like instead of the adhesive.

As described above, a remarkably thinned semiconductor device can be manufactured by mounting an integrated circuit film having a thickness of several μm that is formed from TFTs.

In this embodiment mode, the integrated circuit film in which TFTs are formed is used. However, a semiconductor device including an integrated circuit film in which a memory and the like are formed by using a crystalline semiconductor film formed over a glass substrate or a quartz substrate.

EMBODIMENTS

Embodiment 1

In this embodiment, with reference to FIGS. 2A to 2E, FIGS. 3A to 3D, FIGS. 4A to 4D, and FIGS. 5A and 5B, a method for manufacturing a semiconductor device mounting an integrated circuit film made by a technique for transferring is described.

An integrated circuit film formed in this embodiment has a thickness of several μm and thus, is much thinner than a conventional semiconductor chip. Accordingly, a semiconductor device mounting the integrated circuit film becomes much thinner remarkably. Different from an integrated circuit film made by using a silicon wafer, the integrated circuit film of the present invention is not required to be cleaved depending on a cleaved surface, and therefore, can be cut into various shapes. It is also possible that the thin film integrated circuit is cut in almost the same size as one side of a substrate. Each semiconductor layer is separately formed in an island-like shape. Therefore, stress on a TFT is dispersed, and therefore, the intensity against a stress such as bending is higher than that of an integrated circuit film made from a silicon wafer, and a semiconductor device in mounting and after mounting an integrated circuit film can be resist the external stress such as bending. Further, in the process of the manufacturing a semiconductor device, it is unnecessary to make the integrated circuit film thinner by a back-grinding process, thereby preventing defects from being produced in the back-grinding process. A process of fabricating a TFT and a process of fabricating a protruding electrode can be performed sequentially, since the back-grinding process is not required.

A TFT is formed over a first substrate 700 made of glass according to a method described below.

An insulating film 701 is formed over the first glass substrate 700. In this embodiment, a silicon oxynitride (SiON) film of 100 nm in thickness is formed as the insulating film 701 by PCVD (plasma CVD) method.

A metal film 702 is formed over the insulating film 701. In this embodiment, a tungsten (W) film of 50 nm in thickness is formed as the metal film 702 by a sputtering method.

Figure 2A:
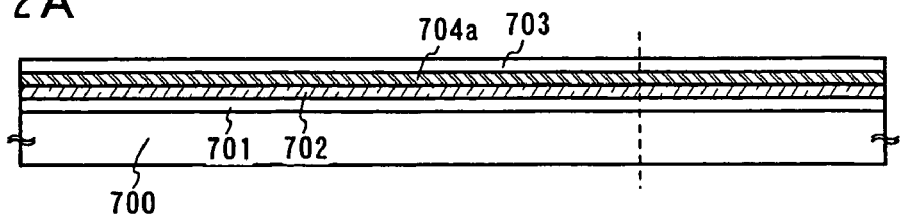
FIGS. 2A to 2E show a method for manufacturing a semiconductor device according to the present invention.

An oxide film 703 is formed over the metal film 702. In this embodiment, a silicon oxide film of 200 nm in thickness is formed as the oxide film 703 by a sputtering method. The formation steps of the metal film 702 and the oxide film 703 are performed sequentially without being exposed to the air. The thickness of the oxide film 703 is not limited to the value described above. However, preferably, it is set twice as thick as the metal film 702 or more. (FIG. 2A)

An amorphous metal oxide film 704a is formed at the interface between the metal film 702 and the oxide film 703 by laminating the metal film 702 and the oxide film 703. In this embodiment, a tungsten oxide film ($WO_X$) of 4 nm in thickness is formed as the metal oxide film 704a, since tungsten as the metal film 702 and silicon oxide as the oxide film 703 are used. Molybdenum (Mo), an alloy of tungsten and molybdenum ($W_X Mo_{1-X}$), or the like may be used instead of tungsten. Further, adding oxygen to the metal oxide film 704a to promote peeling-off in a later process or adding nitrogen to control peeling-off may be performed. Whether adding the elements is performed or not, the amount thereof or the like may be adjusted as necessary.

The metal film 702 and the oxide film 703 formed on an edge face of the substrate are removed by $O_2$-ashing.

A base insulating film 790 is formed over the oxide film 703. The base insulating film 790 is formed of a silicon oxynitride (SiON) film of 100 nm in thickness. The base insulating film 790 is formed in order to prevent impurities from entering a semiconductor layer to be formed in a later process from the glass substrate or the like.

Figure 2B:
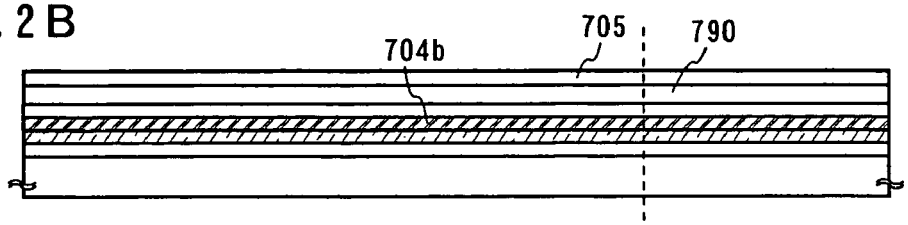

A crystalline semiconductor film 705 is formed. The crystalline semiconductor film 705 is formed by crystallizing an amorphous silicon film that was formed to be 54 nm in thickness. The amorphous silicon film is formed by a PCVD method. The amorphous silicon film contains hydrogen in this embodiment. (FIG. 2B)

The amorphous silicon film contains 21.5 percent hydrogen (composition ratio) in this embodiment. This value is measured from the result that Si—H concentration of the amorphous silicon film is $1.06 \times 10^{22}$ atoms/cm$^3$ and Si—$H_2$ concentration of the amorphous silicon film is $8.34 \times 10^{19}$ atoms/cm$^3$ by quantitative analysis using infrared spectroscopy (FT-IR).

A heat treatment is performed for one hour at 500° C. after Ni that is a catalytic metal element is added to a surface of the amorphous silicon film. Then, in succession, a heat treatment using a furnace is performed for 4 hours at 550° C. to form a first polycrystalline silicon film.

The hydrogen contained in the amorphous silicon film is diffused by heat treatment of 410° C. or more. The amorphous metal oxide film 704a is crystallized to become a crystalline metal oxide film 704b by heat treatment of 400° C. or more. The thickness of the metal oxide film 704b becomes 2 nm by the crystallization. In other words, in this embodiment, diffusion of hydrogen and crystallization of the metal film 704a are performed simultaneously since a heat treatment is performed under a temperature condition of 410° C. or more. Accordingly, the amorphous tungsten oxide becomes crystalline tungsten oxide. A heat treatment of 410° C. or more can be performed in a process except the process of forming the first polycrystalline silicon film as this embodiment.

Then, a second polycrystalline silicon film of which crystallinity is enhanced by irradiating the first polycrystalline silicon film with a excimer laser beam is formed.

A thin oxide film of 1 nm thick is formed over a surface of the second crystalline silicon film by using ozone water, and then, an amorphous silicon film of 100 nm thick is formed thereover by sputtering. A heat treatment is performed using a furnace for 4 hours at 550° C. to move the catalytic metal element contained in the crystalline silicon film into the amorphous silicon film (gettering process). After the gettering process, the amorphous silicon film (that becomes a crystalline silicon film due to the effect of the catalytic metal element after the gettering process in some cases) that becomes unnecessary is removed by TMAH solution and the thin oxide film is removed by hydrofluoric acid to form a crystalline semiconductor film 705.

It is noted that a film surface of the crystalline semiconductor film 705 has a plurality of crystal faces that belong to a plane of a crystal zone<111>.

The crystalline semiconductor film 705 may be formed by a public known crystallization method (such as a solid phase epitaxy, a laser crystallization method) in stead of the crystallization method using Ni as a catalytic metal element described above in this embodiment.

When the crystalline semiconductor film is formed by a laser crystallization method, a pulsed laser or a continuous wave laser which uses excimer (XeCl), YAG, $YVO_4$ as laser medium can be used. When an excimer laser is used, pulse oscillation frequency is set to about 300 Hz and a laser energy density is set to from 100 mJ/cm$^2$ to 400 mJ/cm$^2$. When a YAG laser is used, its second harmonic may be used, pulse oscillation frequency may be set to from 30 Hz to 300 Hz, and a laser energy density may be set to from 300 mJ/cm$^2$ to 600 mJ/cm$^2$. The allover face of the substrate may be irradiated with laser beam that is linearly condensed to have widths from 100 μm to 1000 μm. At this time, an overlap ratio of the linear laser beam may be set to from 50% to 90%. Even when such laser crystallization method is employed, a heat treatment of 410° C. or more, preferably, is conducted to perform diffusion of hydrogen and crystallization of the tungsten oxide.

A semiconductor layers 706a and 706b that are processed into a desired shape and element-separated in island-like shape are formed by patterning and etching the crystalline semiconductor film 705 made by the above-described method.

Before or after the semiconductor layer 706 is formed, adding impurities (channel dope) may be performed to control, a threshold value of a TFT. Boron, phosphorus, or the like may be used as the impurities to be added.

A gate insulating film 707 is formed over the semiconductor layers 706a and 706b. A gate electrode 708 is formed over the gate insulating film 707. A silicon oxide film of 30 nm thick is formed as the gate insulating film 707. A tantalum nitride film (TiN) of 30 nm thick and a tungsten (W) film of 370 nm thick are formed, then patterned and etched to form the gate electrode.

An n-type low concentration impurity region 709 is formed by adding phosphorus that is an n-type impurity. A p-type low concentration impurity region 710 is formed by adding boron that is a p-type impurity.

A sidewall 711 is formed in side parts of the gate electrode 708.

An n-type source (or drain) 712 is formed by adding phosphorus that is an n-type impurity. A p-type source (or drain) 713 is formed by adding boron that is a p-type impurity.

Figure 2C:
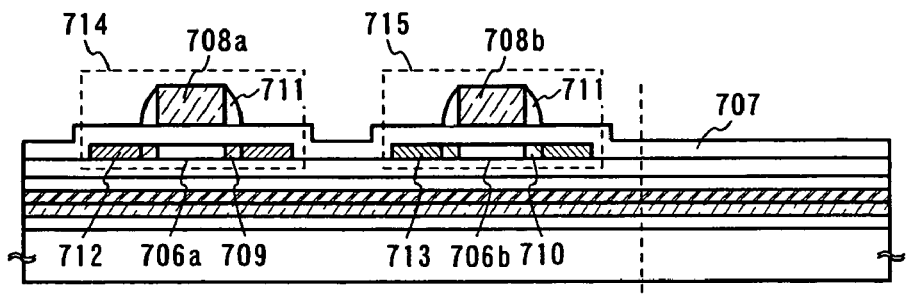

As described above, an n-channel TFT 714 and a p-channel TFT 715 are formed by using the crystalline semiconductor film 705, respectively. (FIG. 2C)

An interlayer insulating film 716 is formed to cover the TFTs 714 and 715. The interlayer insulating film 716 is made of a silicon oxide film. Then, a surface of the interlayer insulating film 716 is planarized. After forming the interlayer insulating film 716, the added impurities are activated.

Contact holes that penetrate the interlayer insulating film 716 and that reach sources (or drains) 712 and 713 are formed.

A wiring 717 and electrode 718 for transmitting electrical signals to the TFTs 714 and 715 are formed. The wiring 717 and electrode 718 are formed from the same layer over the interlayer insulating film 716. In this embodiment, a laminate of titan (Ti), an aluminum film containing 1 percent silicon (Al—Si), and titan (Ti) is formed, and then, the laminate is patterned and etched to form the wiring 717 and electrode 718.

A protective film 719 having an opening portion is formed. A silicon oxide film of 500 nm thick is formed over the interlayer insulating film 716 and then, the opening portion is formed by patterning and etching to form the protective film 719. The electrode 718 is exposed in the opening portion of the protective film 719.

Figure 2D:
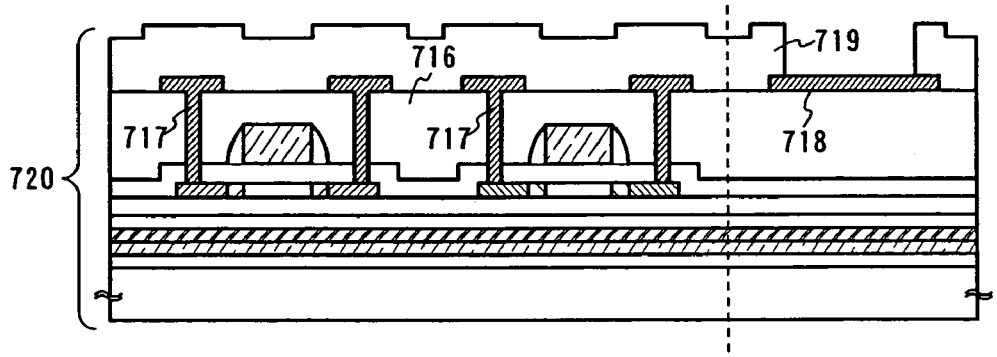
Figure 2E:
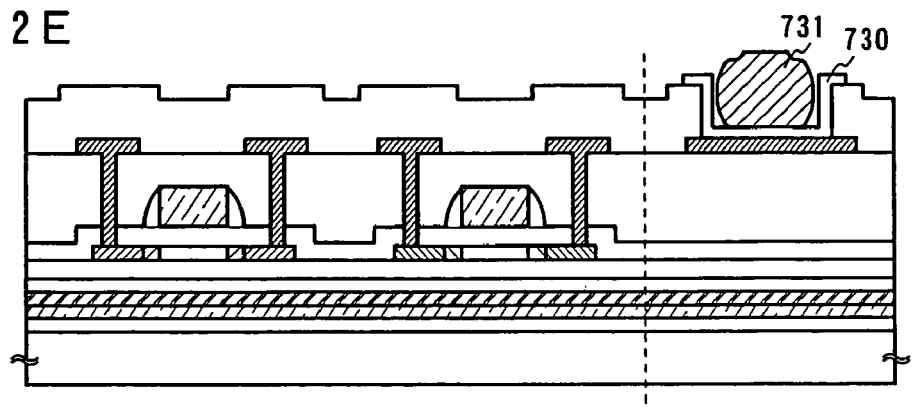

As described above, a layer in which from the base insulating film 705 through the protective film 719 are formed becomes a TFT layer 720. (FIG. 2D)

A conductive film 730 and a protruding electrode (bump) 731 are formed over the electrode 718. The conductive film 730 is formed by laminating chromium (Cr) and copper (Cu). The protruding electrode 731 is made from PbSn or gold (Au) by solder. The thickness of the protruding electrode 731 is 20 μM. The conductive film 730 may be made from other materials that have good adhesion to the protruding electrode 731, instead of the above-described material.

Preferably, the interlayer insulating film 716 and the protective film 719 are formed from a material that has heat resistance of 250° C. or more in order to resist heat of the solder. Either of an inorganic material or an organic material can be employed. (FIG. 2D)

Subsequently, a process for peeling off a TFT layer 720 in which the protruding electrode 731 is formed is described below.

An adhesive 740 is applied over the protective film 719. The adhesive 740 is applied in a thickness of about 60 μm so that the protruding electrode 731 is covered with the adhesive. After the adhesive 740 is applied, the adhesive is baked, and then cured by being irradiated with ultraviolet radiation. In this embodiment, a water-soluble resin having a self-planarizing property is used as the adhesive 740. The adhesive 740 includes a composition such as an epoxy-based, acrylate-based, silicone-based resin or the like.

Figure 3A:
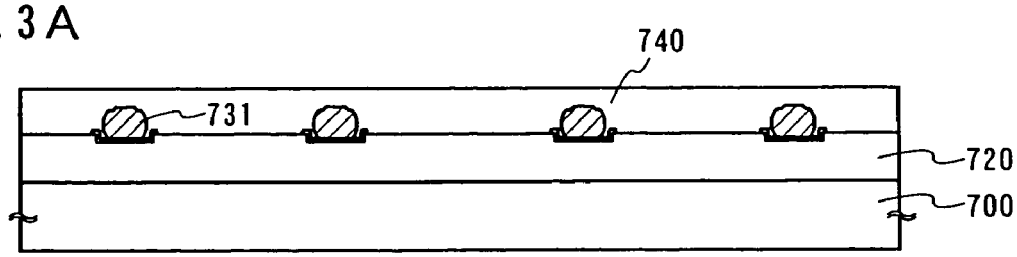
FIGS. 3A to 3D show a method for manufacturing a semiconductor device according to the present invention.
Figure 3B:
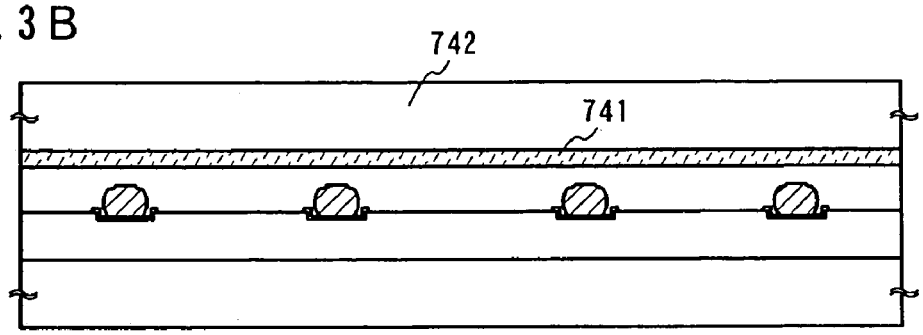

A portion of a periphery of the region to be peeled-off is cut by a diamond pen to be damaged intentionally. The adhesion of the metal film 702, the metal oxide film 704b, and the oxide film 703 at each of the interfaces thereof is reduced in the cutted portion due to the outer pressure. As a result, the peeling-off of the portions is performed easily. Instead of cutting a portion by the diamond pen, the portion may be cut with a press force of 1 mm by a scriber. Alternatively, the periphery of the region to be peeled-off may irradiated locally with a laser beam and may be damaged intentionally in order to reduce the adhesion at each of the interfaces of the metal film 702, the metal oxide film 704b, and the oxide film 703. (FIG. 3A)

Figure 3C:
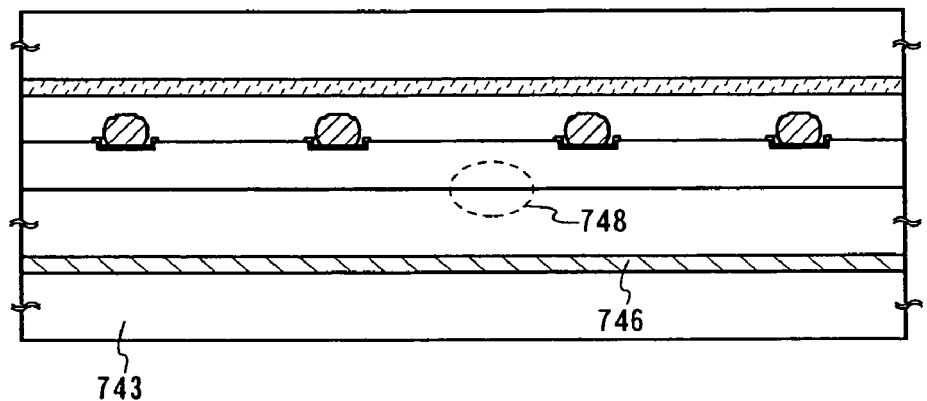
Figure 3D:
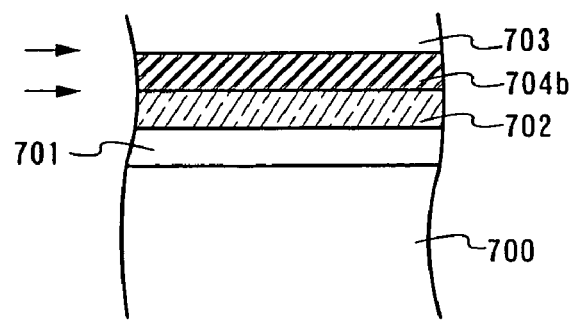

A second substrate 742 is bonded over the adhesive 740 by a two-sided tape 741. Since the adhesive 740 has a self-planarizing property, it is possible to bond a surface of the adhesive 740 to a surface of the substrate 742 in almost parallel. (FIG. 3B) A third substrate 743 is bonded to the first substrate 700 by a two-sided tape 746. The third substrate 743 is boned in order to avoid breakage of the substrate 700. (FIG. 3C)

The interfaces of the metal film 702, the metal oxide film 704b, and the oxide film 703 are each damaged intentionally and the first substrate 700 is peeled-off by a physical means (for example, human hand, air pressure of gas sprayed from a nozzle, ultrasonic waves, or the like).

Figure 4A:
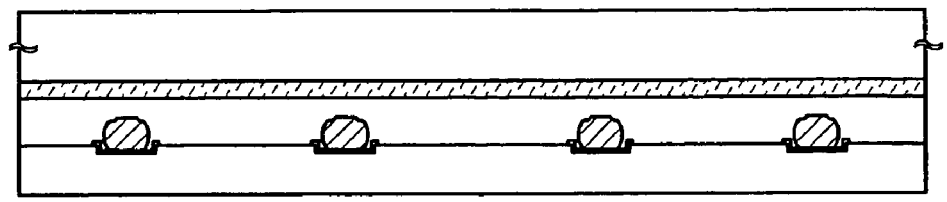
FIGS. 4A to 4D show a method for manufacturing a semiconductor device according to the present invention.

As described above, the TFT layer 720 formed over the first substrate 700 is transferred to the second substrate 742. (FIG. 4A)

After transferring, the metal oxide film 704b and the oxide film 703 are left in a lower portion of the TFT layer 720. In this embodiment, the metal oxide film 704b alone is removed.

A film 744 having a good thermal conductivity is formed over the oxide film 703. In this embodiment, a diamond like carbon (DLC) is formed to be 10 μm in thickness as the film 744. $Al_2O_3$ or the like may be used in the place of DLC.

Figure 4B:
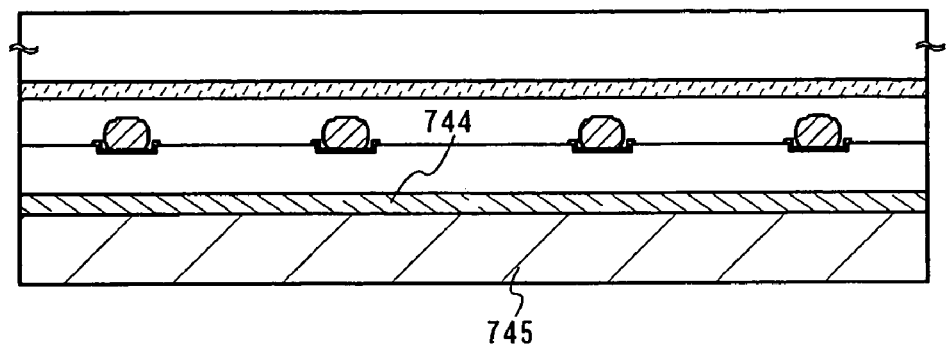

A protective sheet 745 is bonded over the film 744. A sheet having an adherence is used as the protective film 745. (FIG. 4B)

Figure 4C:
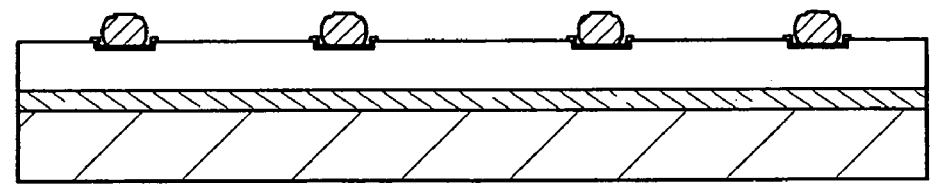

The second substrate 742 is peeled-off from the two-sided tape 741. After the two-sided tape 741 is peeled-off, the adhesive 740 is removed by being dipped into purified water. As a result, the TFT layer 720 is to remain bonded to the protective sheet 745. (FIG. 4C)

Figure 4D:
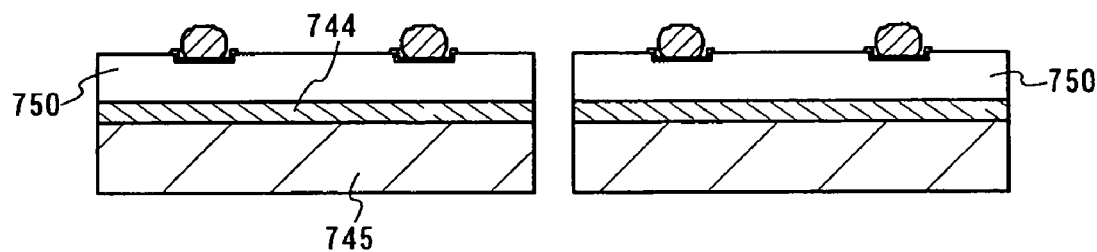

The TFT layer 720 that is bonded to the protective film 745 is cut with the protective sheet 745 and patterned into a desired shape respectively to form a plurality of integrated circuit films 750. (FIG. 4D)

Note that, the second substrate 742 may be peeled-off after the TFT layer is cut. When the second substrate 742 is peeled-off, adherence is required to be considered so that the protective sheet may not be peeled.

In this embodiment, a peeling-off method using a metal film is described. However, the present invention is not limited thereto. A method for dissolving the first substrate, a method of laser irradiation to a backside of the first substrate, or other methods may be employed.

Figure 5A:
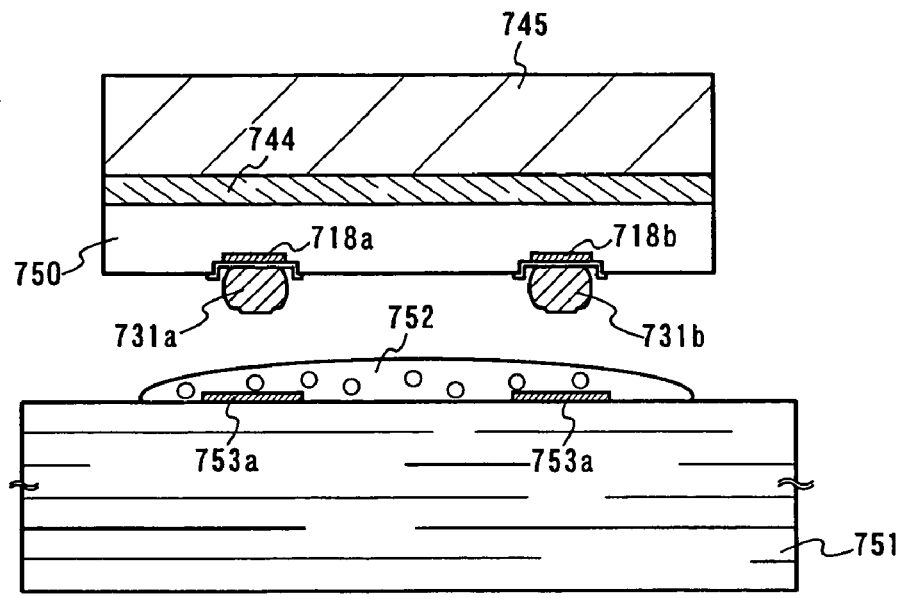
FIGS. 5A and 5B show a method for manufacturing a semiconductor device according to the present invention.
Figure 5B:
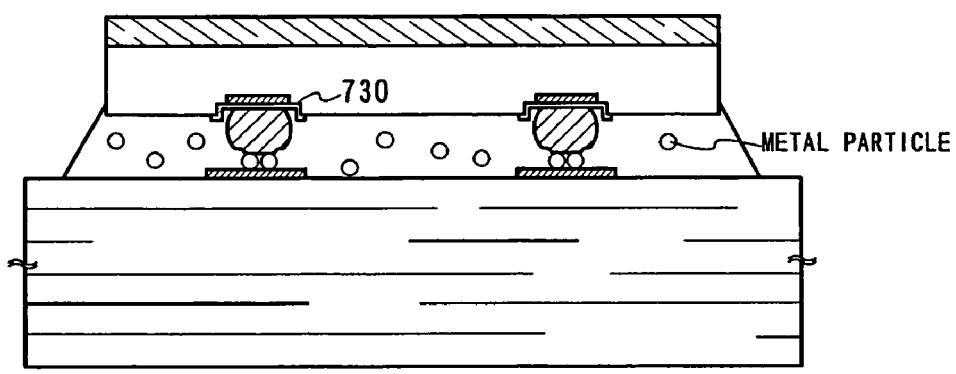

As described above, a method for mounting the integrated circuit film 750 formed by a technique for transferring is described below. (FIG. 5A to FIG. 5B)

An adhesive 752 is applied to a fourth substrate 751 in which a conductive material such as cupper is wired in multi-layer on a polyimide film. An electrode 753 is formed over the fourth substrate 751. Metal particles covered with an insulating film are dispersed into the adhesive 752.

The electrode 718 of the integrated circuit film 750 is aligned over and overlapped with the electrode 753 of the fourth substrate 751, and the fourth substrate 751 is bonded to the integrated circuit film 750. At this time, the protruding electrode 731 formed over the electrode 718 is electrically connected to the electrode 753 via the metal particles within the adhesive 752. The insulating film covering the metal particles is broken due to applied pressure of the protruding electrode 731 and the electrode 753 in the junction thereof, thereby obtaining a conductivity of the insulating film. Meanwhile, insulation property in a portion in which the protruding electrode 731 is not formed is held, since the insulating film is not broken. (FIG. 5A)

The integrated circuit film 750 is irradiated with ultraviolet radiation to peel off the protective sheet 745. The protective sheet 745 may be peeled off before the integrated circuit film 750 is bonded to the fourth substrate 751. (FIG. 5B)

As described above, a semiconductor device of the present invention is manufactured.

Embodiment 2

Figure 6A:
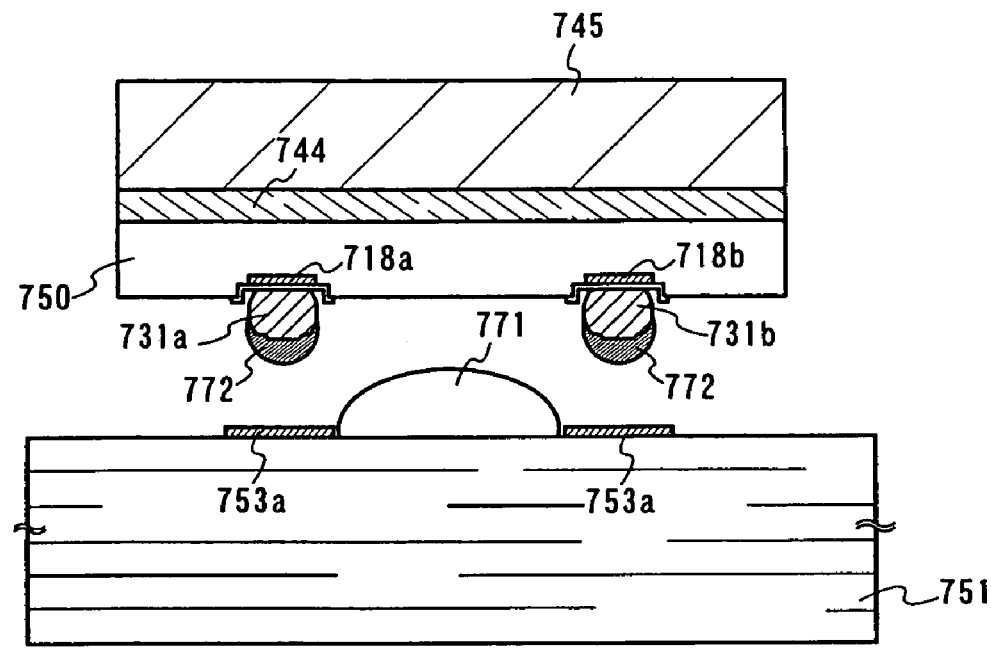
FIGS. 6A and 6B show a method for manufacturing a semiconductor device according to the present invention.
Figure 6B:
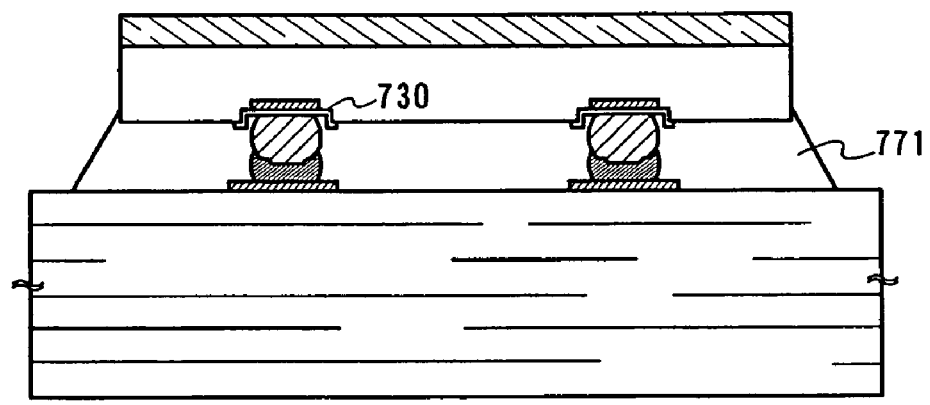

In this embodiment, a semiconductor device made by bonding an integrated circuit film 750 to a fourth substrate 751 in a different manner from that in Embodiment 1 is described with reference to FIGS. 6A and 6B.

A resin 771 is applied to the fourth substrate 751 in which a conductive material such as cupper is wired in multi-layer in a polyimide film. An electrode 753 is formed over the fourth substrate 751.

A conductive paste 772 is attached to a protruding electrode 731.

An electrode 718 of the integrated circuit film 750 is aligned over and overlapped with the electrode 753 of the fourth substrate 751 to bond the electrode 753 to the protruding electrode 731.

The integrated circuit film 750 is provided with supersonic vibration to diffuse the resin 771 into a whole space between the integrated circuit film 750 and the fourth substrate 751. A heat treatment is performed to cure the resin 771.

Then, the integrated circuit film 750 is irradiated with ultraviolet radiation to peel off a protective sheet 745. Note that, the protective sheet 745 may be peeled off before bonding the integrated circuit film 750 to the fourth substrate 751.

As described above, a semiconductor device of the present invention is manufactured. The semiconductor device according to this embodiment becomes much thinner as compared with a conventional semiconductor chip, since the integrated circuit film of this embodiment has a thickness of several μm, as that of Embodiment 1.

Embodiment 3

In this embodiment, a multi-film module manufactured using an integrated circuit film made by a technique for transferring is described with reference to FIGS. 7A and 7B.

A crystalline semiconductor film is formed by the method of the processes for forming up to the crystalline semiconductor film 705 described in Embodiment 1. After that, a CPU, a flash memory, a SRAM, a DRAM, and a Logic are formed over different substrates by using the crystalline semiconductor film.

Integrated circuit films 7001, 7002, 7003, 7004, and 7005 mounting the CPU, the flash memory, the SRAM, the DRAM, and the Logic respectively, are formed by the same method as the method of the process after forming the TFTs 714 and 715 described in Embodiment 1. In this embodiment, films comprising a good thermal conductive material are provided for each one side of the integrated circuit films 7001 to 7005.

The integrated circuit films 7001 to 7005 are each bonded to a fifth substrate 7010 in which multi-wired layers are formed in both surfaces of a printed board. At this time, as the method for bonding, one of the mounting methods described in Embodiment 1 or 2 is used.

Figure 7A:
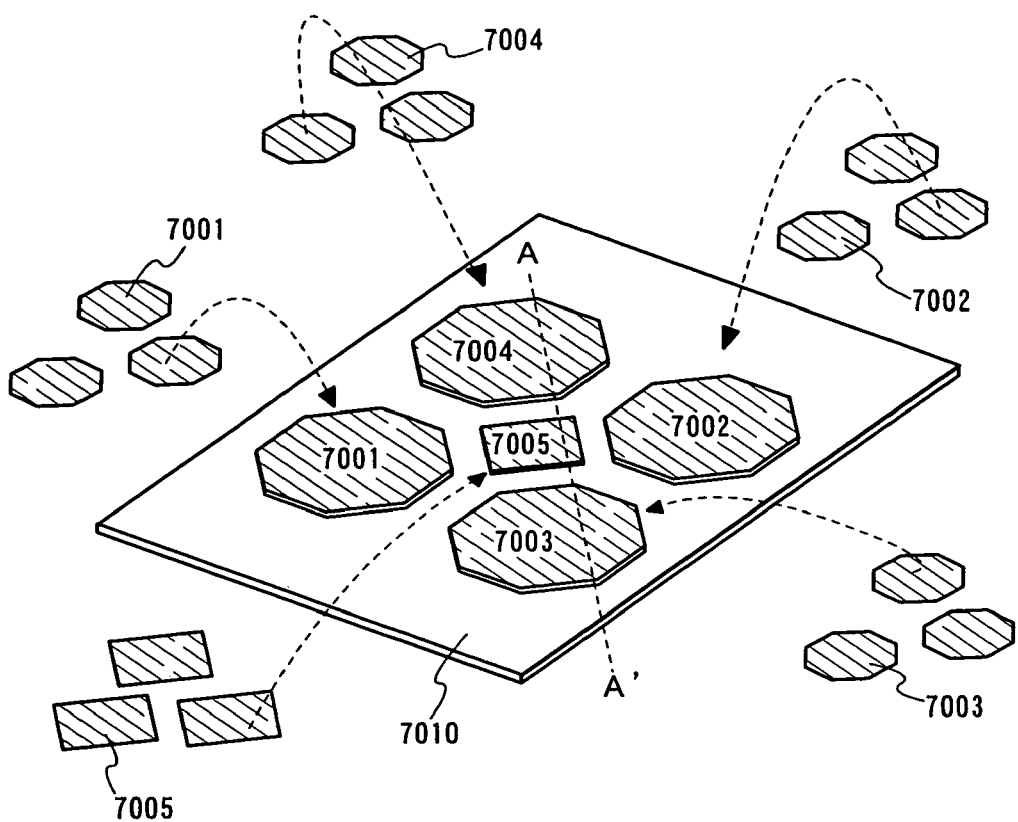
FIGS. 7A and 7B show a method for manufacturing a semiconductor device according to the present invention.
Figure 7B:
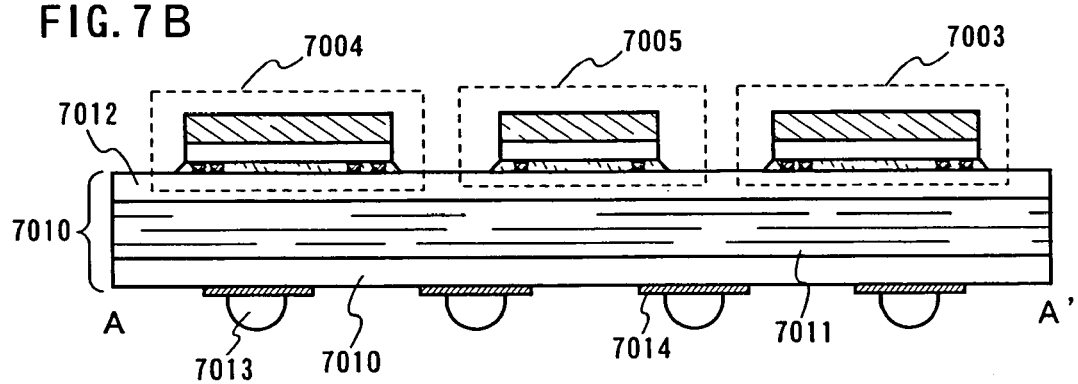

FIG. 7B shows a cross-sectional view A–A' in FIG. 7A. In FIG. 7B, the integrated circuit films 7001 to 7005 are mounted over the fifth substrate 7010.

As described in Embodiment 1, the integrated circuit film of the present invention can be cut into various shapes, since the integrated circuit film is not required to be cleaved depending on a cleaved surface as a silicon wafer. Accordingly, an arrangement of the integrated circuit films 7001 to 7005 and an arrangement of wirings in the fifth substrate 7010 can have more possibilities in the fifth substrate.

As described above, a flip-chip type multi-film module can be manufactured. The multi-film module of the present invention is formed by using an integrated circuit film made by a technique for transferring, and thus the multi-film module becomes thinner extremely.

Embodiment 4

In this embodiment, examples of electronic devices mounting the semiconductor device of the present invention are described with reference to FIGS. 10A to 10E. A thinner electronic device can be realized by mounting the semiconductor device of the present invention. Note that, the semiconductor device of the present invention is mounted as shown in FIG. 8 and FIGS. 9A and 9B, and then, installed in each part within a main body of the electronic devices.

Figure 8:
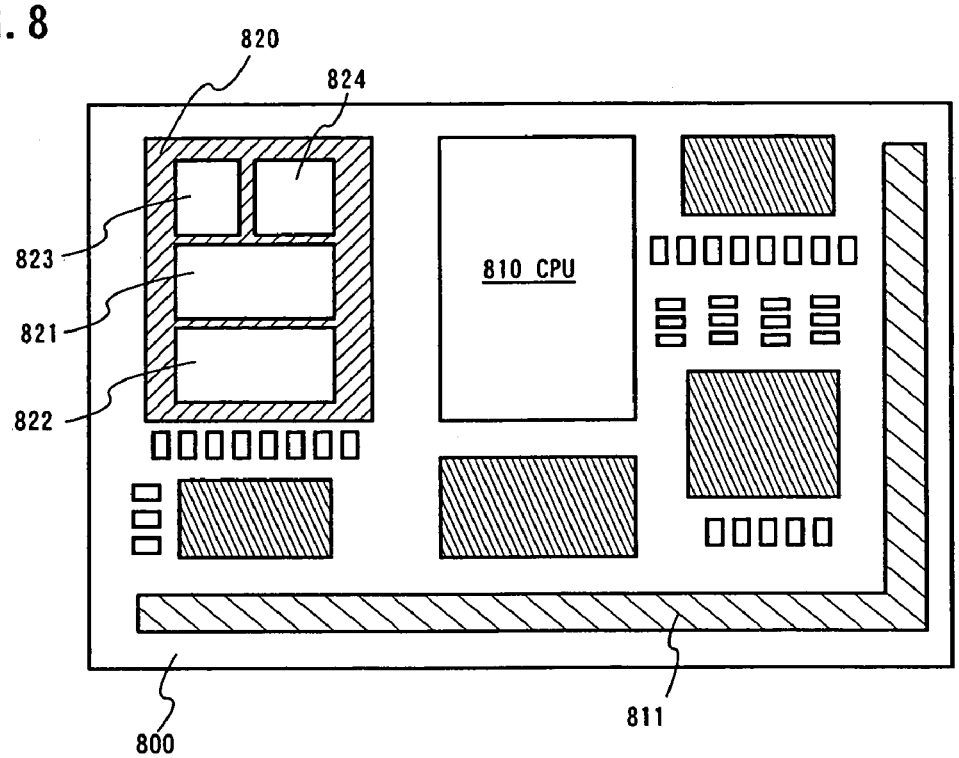
FIG. 8 is a pattern diagram showing a module to which a semiconductor device of the present invention is applied.

In FIG. 8, a multi-film module 820 manufactured according to the present invention is provided for a mother board 800. Multiple integrated circuit films 821 to 824 are mounted over the multi-film module 820. The integrated circuit films each mount a Logic 821, a Flash Memory 822, a SRAM 823, and a DRAM 824, which are formed over different substrates and then, manufactured by a technique for transferring. A CPU 810 and a Logic 811 are made thinner according to the present invention. Various shapes such as L-shape can be applied thereto, as the semiconductor device Logic 811 of the present invention has an L-shape. Embodiments 1 to 3 show an example of a face-down type semiconductor device. However, a wire-bonding method may be employed to mount devices. In this case, integrated circuit films having various shapes can be mounted.

Figure 9A:
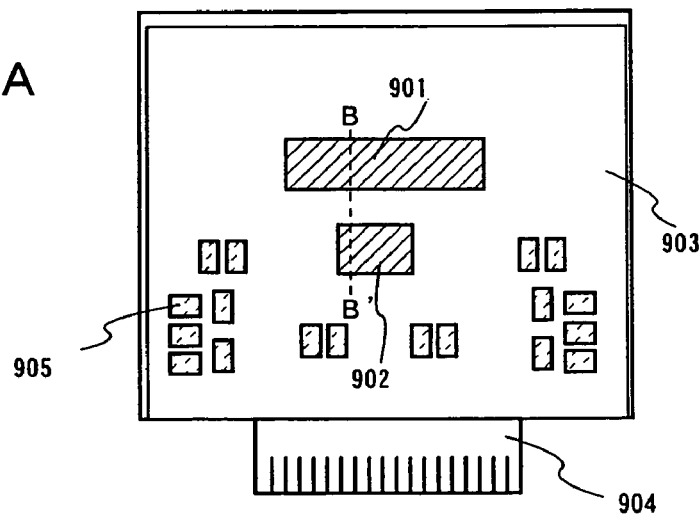
FIGS. 9A and 9B are pattern diagrams showing a module to which a semiconductor device of the present invention is applied.
Figure 9B:
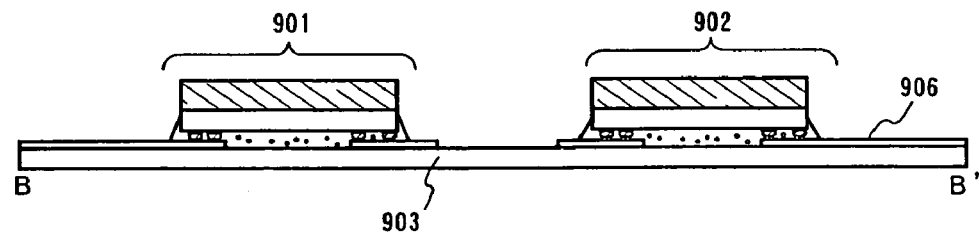

In FIG. 9A, a driver 901 and a controller 902 are mounted over a substrate 903. FIG. 9B shows a cross-sectional view B–B' in FIG. 9A. An FPC 904 is provided for the substrate 903 and is connected to a display device or the like via the FPC 904. The driver 901 and the controller 902 are semiconductor devices according to the present invention. In this embodiment, the substrate 903 is a flexible substrate.

Figure 10A:
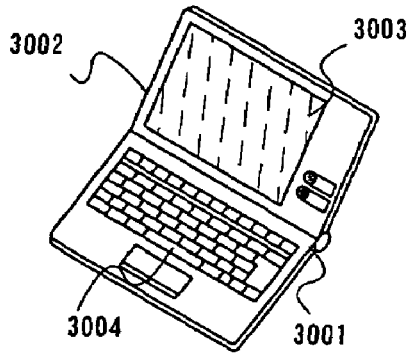
FIGS. 10A to 10E show electronic devices to which a semiconductor device of the present invention is applied.

FIG. 10A is a laptop personal computer manufactured according to the present invention. The laptop personal computer includes a main body 3001, a casing 3002, a display portion 3003, a keyboard 3004, and the like.

Figure 10D:
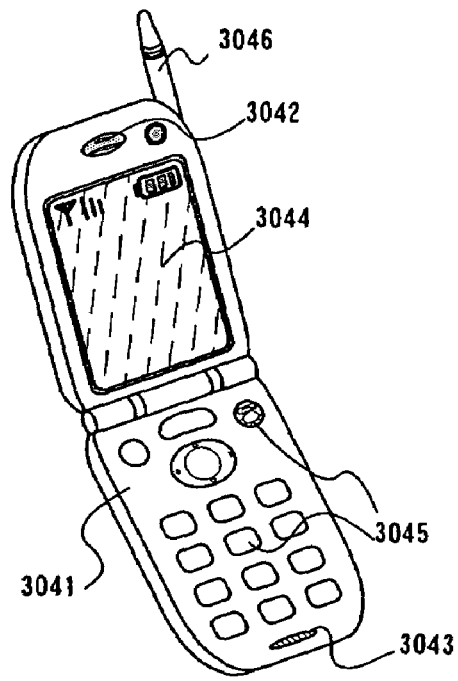
Figure 10B:
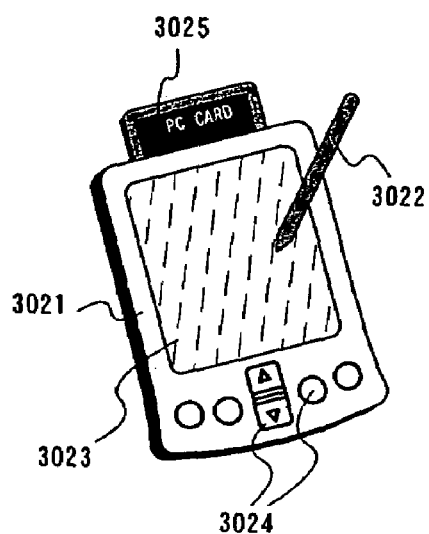

FIG. 10B is a portable information terminal (PDA) manufactured according to the present invention. The portable information terminal includes a main body 3021, a display portion 3023, an external interface 3025, operation keys 3024, and the like. As an attachment for operation, a stylus pen 3022 is shown in FIG. 10B.

Figure 10C:
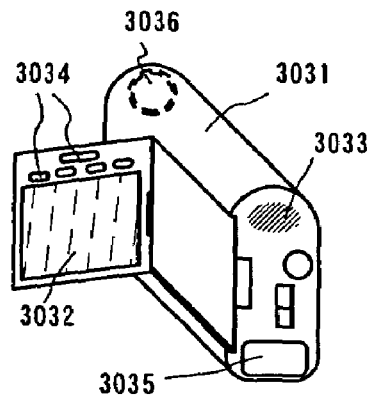

FIG. 10C is a video camera manufactured according to the present invention. The video camera includes a main body 3031, a display portion 3032, an audio input section 3033, operation keys 3034, a battery 3035, an image receiving section 3036, and the like.

FIG. 10D is a cellular phone manufactured according to the present invention. The cellular phone includes a main body 3041, a display portion 3044, an audio output section 3042, an audio input section 3043, operation keys 3045, an antenna 3046, and the like.

Figure 10E:
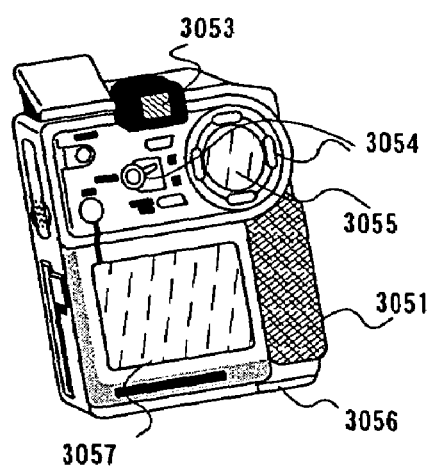

FIG. 10E is a digital camera manufactured according to the present invention. The digital camera includes a main body 3051, a display portion A 3057, an eye piece portion 3053, operation keys 3054, a display portion B 3055, a battery 3056, and the like.

The integrated circuit film mounted over the semiconductor device of the present invention has a thickness of several μm and is much thinner than a conventional one. Accordingly, the semiconductor device of the present invention mounting the integrated circuit film becomes thinner dramatically. The integrated circuit film can be cut into various shapes. Thus, for example, when multiple integrated circuit films are mounted over one multi-layer wiring board, the layout thereof is diversified and the density in mounting becomes high. The integrated circuit film mounted over the semiconductor device of the present invention has island-like separated semiconductor films. Therefore, a stress on a TFT is dispersed and therefore, the intensity against a stress such as bending is higher than that of an integrated circuit film made from a silicon wafer, and a semiconductor device in mounting and/or after mounting an integrated circuit can resist the external stress such as bending. Further, in the process of the manufacturing a semiconductor device, it is unnecessary to make the integrated circuit film thinner by grinding a backside thereof, thereby preventing defects from being produced in the back-grinding process and enhancing a process yield. The back-grinding process is not required, and therefore, a process of manufacturing a TFT and a process of manufacturing a protruding electrode (bump) can be performed sequentially.

What is claimed is:

1. A method for manufacturing a semiconductor device comprising the steps of:
   forming a crystalline semiconductor film over a first substrate;
   forming an element layer comprising an element using the crystalline semiconductor film, a wiring for transmitting an electrical signal to the element, and an insulating film;
   transferring the element layer from the first substrate to a second substrate;
   transferring the element layer from the second substrate to a sheet; and
   dividing the element layer into at least one integrated circuit film after transferring the element layer from the second substrate to the sheet.

2. A method for manufacturing a semiconductor device according to claim 1, further comprising forming a protruding electrode for transmitting an electrical signal to the wiring over the element layer, wherein the protruding electrode is formed before transferring the element layer to the second substrate.

3. A method for manufacturing a semiconductor device according to claim 1, wherein a film of which thermal conductivity is 10 W/m·K or more is formed over the element layer after transferring the element layer to the second substrate.

4. A method for manufacturing a semiconductor device comprising the steps of:
   forming a crystalline semiconductor film over a first substrate;
   forming an element layer comprising an element using the crystalline semiconductor film, a wiring for transmitting an electrical signal to the element, and an insulating film;
   forming a protruding electrode over the element layer for transmitting an electrical signal to the wiring;
   transferring the element layer from the first substrate to a second substrate so as to dispose the protruding electrode between the second substrate and the element layer;
   forming a thermal conductivity film on the element layer;
   transferring the element layer and the thermal conductivity film from the second substrate to a sheet; and
   dividing the element layer into at least one integrated circuit film after transferring the element layer and the thermal conductivity film from the second substrate to the sheet.

5. A method for manufacturing a semiconductor device according to claim 4, wherein the protruding electrode is formed before transferring the element layer to the second substrate.

6. A method for manufacturing a semiconductor device according to claim 4, wherein the thermal conductivity of the thermal conductivity film is 10 W/m·K or more.

7. A method for manufacturing a semiconductor device comprising the steps of:
   forming an element layer comprising a thin film transistor having a semiconductor layer including at least a channel forming region, a wiring connected to the thin film transistor, and an insulating film over a first substrate;
   forming a protruding electrode over the element layer for transmitting an electrical signal to the wiring;
   transferring the element layer from the first substrate to a second substrate so as to dispose the protruding electrode between the second substrate and the element layer;
   forming a thermal conductivity film on the element layer;
   transferring the element layer and the thermal conductivity film from the second substrate to a sheet; and
   dividing the element layer into at least one integrated circuit film after transferring the element layer and the thermal conductivity film from the second substrate to the sheet.

8. A method for manufacturing a semiconductor device according to claim 7, wherein the protruding electrode is formed before transferring the element layer to the second substrate.

9. A method for manufacturing a semiconductor device according to claim 7, wherein the thermal conductivity of the thermal conductivity film is 10 W/m·K or more.

10. A method for manufacturing a semiconductor device comprising the steps of:
    forming a crystalline semiconductor film over a first substrate;
    forming an element layer comprising an element using the crystalline semiconductor film, a wiring for transmitting an electrical signal to the element, and an insulating film;
    forming a protruding electrode over the element layer for transmitting an electrical signal to the wiring;
    transferring the element layer from the first substrate to a second substrate so as to dispose the protruding electrode between the second substrate and the element layer;
    forming a thermal conductivity film on the element layer;
    transferring the element layer and the thermal conductivity film from the second substrate to a sheet;
    dividing the element layer into at least one integrated circuit film after transferring the element layer and the thermal conductivity film from the second substrate to the sheet;
    electrically connecting the integrated circuit film to an electrode of a wiring board by the protruding electrode; and
    removing the sheet from the integrated circuit film.

11. A method for manufacturing a semiconductor device according to claim 10, wherein the thermal conductivity of the thermal conductivity film is 10 W/m·K or more.

12. A method for manufacturing a semiconductor device according to claim 10, wherein the wiring board includes the plurality of integrated circuit films.

13. A method for manufacturing a semiconductor device according to claim 10, wherein wiring board comprises polyimide film in which a conductive material such as cupper is wired in multi-layer.

14. A method for manufacturing a semiconductor device according to claim 10, wherein the integrated circuit film has a polygonal shape.

15. A method for manufacturing a semiconductor device according to claim 10, wherein the protruding electrode is electrically connected to the electrode of the wiring board via the metal particles within the adhesive.

16. A method for manufacturing a semiconductor device according to claim 10, wherein the protruding electrode is electrically connected to the electrode of the wiring board via a conductive paste.

17. A method for manufacturing a semiconductor device according to claim 10, wherein a CPU, a flash memory, a SRAM, a DRAM, and a Logic are formed by using the integrated circuit film.

18. A method for manufacturing a semiconductor device comprising the steps of:
    forming a crystalline semiconductor film over an insulating substrate;
    forming an element layer comprising an element using the crystalline semiconductor film, a wiring for transmitting an electrical signal to the element, and an insulating film;
    transferring the element layer from the insulating substrate to a substrate;
    transferring the element layer from the substrate to a sheet; and
    dividing the element layer into at least one integrated circuit film after transferring the element layer from the substrate to the sheet.

19. A method for manufacturing a semiconductor device according to claim 18, further comprising forming a protruding electrode for transmitting an electrical signal to the wiring over the element layer, wherein the protruding electrode is formed before transferring the element layer to the substrate.

20. A method for manufacturing a semiconductor device according to claim 18, wherein a film of which thermal conductivity is 10 W/m·K or more is formed over the element layer after transferring the element layer to the substrate.

* * * * *